United States Patent
Feldotte et al.

(10) Patent No.: US 12,188,810 B2
(45) Date of Patent: Jan. 7, 2025

(54) GRAVIMETRIC MEASURING SYSTEM

(71) Applicant: SARTORIUS LAB INSTRUMENTS GMBH & CO. KG, Goettingen (DE)

(72) Inventors: Heinrich Feldotte, Goettingen (DE); Michael Laubstein, Goettingen (DE); Jan Von Steuben, Goettingen (DE); Malte Staender, Heilbad Heiligenstadt (DE); Heyko Holst, Goettingen (DE)

(73) Assignee: SARTORIUS LAB INSTRUMENTS GMBH & CO., KG, Goettingen (DE)

( * ) Notice: Subject to any disclaimer, the term of this patent is extended or adjusted under 35 U.S.C. 154(b) by 520 days.

(21) Appl. No.: 17/394,792

(22) Filed: Aug. 5, 2021

(65) Prior Publication Data

US 2021/0364342 A1 Nov. 25, 2021

Related U.S. Application Data

(63) Continuation of application No. PCT/EP2020/052678, filed on Feb. 4, 2020.

(30) Foreign Application Priority Data

Feb. 5, 2019 (DE) .................... 10 2019 102 810.8

(51) Int. Cl.
*G01G 21/28* (2006.01)
*G01G 23/48* (2006.01)
(Continued)

(52) U.S. Cl.
CPC .......... *G01G 21/286* (2013.01); *G01G 23/48* (2013.01); *H05K 5/02* (2013.01); *H05K 7/18* (2013.01)

(58) Field of Classification Search
CPC .......... H05K 5/02; H05K 5/0034; H05K 5/03; H05K 7/1421; H05K 7/1425; H05K 7/18; G01G 21/28; G01G 21/286; G01G 23/48
See application file for complete search history.

(56) References Cited

U.S. PATENT DOCUMENTS 4,313,025 A * 1/1982 Grube, Jr. ................ H05K 5/03
  220/555
6,134,615 A * 10/2000 Chari .................... H05K 7/1498
  715/835

(Continued)

FOREIGN PATENT DOCUMENTS

DE 102009055624 A1 5/2011
DE 102009055622 B4 8/2014

(Continued)

OTHER PUBLICATIONS

International Search Report, PCT/EP2020/052679, May 27, 2020, 8 pages.

*Primary Examiner* — Randy W Gibson

(74) *Attorney, Agent, or Firm* — Edell, Shapiro & Finnan, LLC

(57) ABSTRACT

A gravimetric measuring system (10) includes a balance (12) with a weighing chamber (22) surrounded by a plurality of weighing chamber walls (23, 24, 26, 28); an electromechanical weighing system (181) enclosed by an adjoining weighing system chamber (18); and an electronic control apparatus (36) for controlling the system operation according to algorithms stored in a memory (363) of the control apparatus. A plurality of functional modules (14, 16) that generate heat during operation are insertable into module receptacles (283) arranged on at least one weighing chamber wall (28). A plurality of interacting measures, such as providing the module receptacles with device-side identification and thermal interface components and the functional modules with module-side identification and thermal interface components that interact, lead to a controllable measuring system that is flexibly equipped and calibratable.

7 Claims, 4 Drawing Sheets

(51) Int. Cl.
*H05K 5/02* (2006.01)
*H05K 7/18* (2006.01)

(56) References Cited

U.S. PATENT DOCUMENTS

| | | | |
|---|---|---|---|
| 6,951,989 B2 * | 10/2005 | Nufer | G01G 23/00 |
| | | | 177/180 |
| 8,674,823 B1 * | 3/2014 | Contario | G01R 19/145 |
| | | | 340/693.1 |
| 9,520,043 B1 * | 12/2016 | Alshinnawi | G06F 13/4068 |
| 10,393,570 B2 | 8/2019 | Esser et al. | |
| 10,642,321 B2 * | 5/2020 | Aimone | H05K 7/1498 |
| 2002/0040814 A1 | 4/2002 | Luchinger et al. | |
| 2003/0115929 A1 | 6/2003 | Luchinger et al. | |
| 2004/0104055 A1 | 6/2004 | Nufer et al. | |
| 2005/0067197 A1 | 3/2005 | Rotach et al. | |
| 2011/0291813 A1 * | 12/2011 | Jansma | H05K 7/1498 |
| | | | 340/10.5 |
| 2013/0264889 A1 * | 10/2013 | Quittek | H04B 3/54 |
| | | | 324/649 |
| 2014/0015857 A1 * | 1/2014 | Smith | G06F 3/048 |
| | | | 345/629 |
| 2014/0265794 A1 * | 9/2014 | Schroeder | A47B 88/477 |
| | | | 267/141 |
| 2015/0113296 A1 * | 4/2015 | Slotten | G06F 1/189 |
| | | | 713/310 |
| 2015/0311649 A1 * | 10/2015 | Horne | H01R 13/6691 |
| | | | 439/489 |
| 2016/0250628 A1 | 9/2016 | Graf et al. | |
| 2016/0252389 A1 * | 9/2016 | Esser | H01L 21/67 |
| | | | 177/25.13 |
| 2021/0385960 A1 * | 12/2021 | Horii | H05K 5/03 |

FOREIGN PATENT DOCUMENTS

| | | | | |
|---|---|---|---|---|
| DE | 102014101558 A1 | 5/2015 | | |
| DE | 102014101561 A1 | 5/2015 | | |
| EP | 1195584 A1 | 4/2002 | | |
| EP | 1312902 A1 | 5/2003 | | |
| EP | 1367372 A1 | 12/2003 | | |
| EP | 1396711 B1 | 3/2004 | | |
| EP | 3557199 A1 | 10/2019 | | |
| JP | H0228522 A | 1/1990 | | |
| JP | 2586115 B2 | 2/1997 | | |
| WO | WO 2013-111340 | * | 8/2013 | H05K 7/1425 |

\* cited by examiner

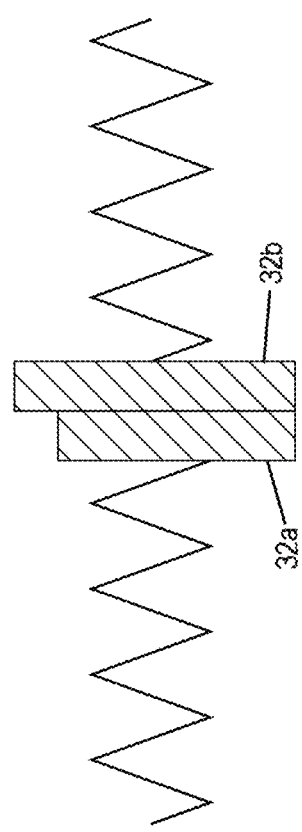

GRAVIMETRIC MEASURING SYSTEM

CROSS REFERENCE TO RELATED APPLICATIONS

This is a Continuation of International Application PCT/EP2020/052678, which has an international filing date of Feb. 4, 2020, and which claims the priority of German Patent Application 10 2019 102 810.8, filed Feb. 5, 2019. The disclosures of both applications are incorporated in their respective entireties into the present Continuation by reference.

FIELD OF THE INVENTION

The invention relates to a gravimetric measuring system, comprising
- a balance with a weighing chamber, surrounded by a plurality of weighing chamber walls; an electromechanical weighing system, enclosed by an adjoining weighing system chamber; and an electronic control apparatus for controlling the system operation according to algorithms stored in the memory of the control apparatus; and
- a plurality of functional modules, which generate heat during operation and which can be inserted, as necessary, into module receptacles, arranged on at least one weighing chamber wall.

BACKGROUND

Gravimetric measuring systems of this type are known from EP 1 195 584 A1.

Analytical and laboratory balances, in particular, those that work on the principle of electromagnetic compensation, are well known. In this case an electromechanical weighing system, i.e., a typically complex lever mechanism with an input-side load receptacle and an output-side plunger coil arrangement, is arranged in a weighing system chamber, which is intended to ensure a shielding that is as good as possible with respect to environmental influences. A carrier, connected to the load receptacle, projects into a usually adjacent weighing chamber, which is also largely shielded from the environment, in particular, by its weighing chamber wall. The weighing chamber wall usually consists of the weighing chamber base, the weighing chamber cover, weighing chamber side walls as well as a front and rear wall. The rear wall may often coincide with a wall of the weighing system chamber. One side wall or both side walls of the weighing chamber are often designed as movable draft shield elements. The cover and/or the front side may also contain, as a rule, closable access openings. The coupling of the carrier to the load receptacle of the weighing system usually passes through the rear wall or the base of the weighing chamber.

Furthermore, such balances always contain a control apparatus, which controls, in particular, the weighing sensor system and, in so doing, specifically controls the plunger coil arrangement of the weighing system. However, the control apparatuses of modern balances can be designed to be significantly more complex and, in particular, can provide different operating routines of the system operation. Such operating routines may relate to the control of the sensor system or a cooling apparatus, but may relate, as an alternative or in addition, to the control of certain auxiliary apparatuses in or on the weighing chamber. Purely by way of example, mention may be made here of a cooling apparatus, a draft shield controller, lifting apparatuses inside the weighing chamber, lighting apparatuses and the like.

It is known from the representative document, mentioned in the introduction, to make such auxiliary apparatuses incorporating a weighing function available in the form of modules, i.e., as modules relating to the weighing function—in short: functional modules—and to provide a rail-like holding apparatus in the weighing chamber, in particular, on the rear wall thereof. Such holding apparatus have various mechanical interfaces, to which functional modules, required in the specific individual case, can be attached in the respectively required position. In other words, such functional modules can be inserted, as required, into corresponding module receptacles on the weighing chamber wall. Such a modular system is particularly advantageous in laboratory environments, in which different weighing tasks have to be carried out using one and the same balance. The balance can then be assembled by the user himself in accordance with his specific requirement in his particular case. Even in cases, where the mechanical interfaces are designed such that the user cannot swap modules, such modular systems are also advantageous for the manufacturer. Using the same balance base body as a starting point, it is possible to pre-assemble balances for different weighing tasks by selecting the functional modules inserted into the module receptacles. The number of special parts to be produced is drastically reduced, an aspect that leads to a significant cost cutting.

The problem with this concept is the fact that such modules, the combination of a plurality of such modules and different mounting locations inside the balance, must not change the metrological properties of the balance. In the first place, a degradation of the metrological performance would not be acceptable to the user. In the second place, changes in the metrological properties resulting from auxiliary apparatuses, which are not free from retroactive effects, such as those that said functional modules can represent, are not even permissible at all for systems that require approval (calibration certificate). Auxiliary apparatuses, which are not free from retroactive effects, and their combinations have to be allowed in a complex method, if there are grounds for concern about changes in the metrological properties. It is known that the introduction of heat sources into a balance, in particular, into the weighing chamber, without suitable countermeasures will lead to such an undesired change in the metrological properties.

The post-published European patent document EP 3 557 199 A1 discloses a balance with a weighing chamber rear wall, which can be assembled from a plurality of wall elements, the height of this rear wall being adapted to different draft shield heights, such that weighing chambers of different heights can be constructed.

The European patent document EP 1 312 902 A1 discloses a balance, on the weighing chamber rear wall of which an electronic auxiliary unit, in which supply units, for example, a battery, or even an electronic control unit, can be arranged, so that a functional module, as defined herein, can be attached. The document does not make any reference to the associated problem of heat input into the weighing chamber.

The European patent document EP 1 396 711 B1 discloses a balance with a weighing chamber, which is not equipped with any functional modules; and said balance dissipates the heat of the weighing electronics and out of the weighing chamber with a thermoelectric element, where in this case the special thermal coupling to the weighing chamber rear wall ensures the formation of a temperature gradient inside the weighing chamber.

The German patent document DE 10 2014 101 561 A1 discloses a gravimetric dosing apparatus with a climate measuring module arranged in the weighing chamber. Based on the climate data determined with said climate measuring module, the components, which are to be mixed in accordance with the dosing process, can be temperature-controlled beforehand outside the apparatus.

The German patent document DE 10 2009 055 624 A1 discloses a balance with weighing electronics, which are arranged in a housing substructure and which are shielded against, in particular, the weighing chamber with a thermal shielding plate, with the shielding plate being connected to the cooling side of a thermoelectric module.

A similar approach is used in the Japanese patent document JP 2 586 115 B2, where in this case the thermally shielded weighing electronics are located in a housing behind the weighing chamber.

SUMMARY

An object of the present invention is to further develop a gravimetric measuring system of the generic type such that the result is a system that can be flexibly adapted to different application scenarios, but is nonetheless calibratable.

This object is achieved by gravimetric measuring systems distinguishing over known systems in that the module receptacles have
  device-side thermal interface components, which are thermally connected to one another and to a central cooling apparatus, and
  in each case a device-side identification interface component;
and the functional modules have
  module-side thermal interface components, which correspond to the device-side thermal interface components and which in the inserted state of the respective functional module thermally contact the device-side thermal interface component of the respectively associated module receptacle, and
  in each case a module-side identification interface component, which corresponds to the device-side identification interface component,
wherein the control apparatus is programmed to identify each functional module, inserted into a module receptacle, through interaction between the respective device-side and module-side identification interface components and to select one of a plurality of operating routines according to algorithms stored in the memory thereof;
and wherein the at least one weighing chamber wall, which forms a separating element between the weighing chamber and the weighing system chamber, is designed as a carrier structure, which is constructed, for example, of posts and struts, which between them define recesses, which leave the predominant portion of the wall surface free and form said module receptacles, and said recesses are closed by a securely installed end wall on the weighing system chamber side and are closable optionally either with panels, which have no weighing function and which are spatially adapted in each case to these recesses, or with these functional modules.

Preferred embodiments are the subject matter of the dependent claims.

The invention combines several aspects, which are technically feasible in isolation, but interact in a particularly advantageous manner with regard to the aforementioned object of calibratability.

According to a first aspect, the invention provides for constructing at least that weighing chamber wall, which represents the separating wall to the weighing system chamber, but preferably a plurality of weighing chamber walls, as a ribbed or lattice structure, which offers a plurality of identically formed recesses for the insertion of different functional modules. Due to the identical design of these module receptacles it is possible to install correspondingly identically formed, but differently effective functional modules at virtually any point of the weighing chamber wall, in particular, where they are needed according to the current requirements. The design of the module receptacles as recesses also makes it possible to position additional connections, which will also be discussed further below, outside the weighing chamber, so that only the components, which are absolutely necessary in the weighing chamber, are located in the weighing chamber itself. This aspect is very important in terms of safety, cleanliness, temperature management, etc. However, this first aspect alone still does not fulfill the requirements of a calibratable system with respect to the thermal management, on the one hand, and with respect to sealing the weighing system chamber, on the other hand.

Therefore, according to a second aspect, at least two types of interfaces are provided, each of which consists of a device-side and a module-side interface component; and both types of interface components interact with one another in the state of a functional module inserted into a module receptacle. In particular, these components are thermal interfaces, on the one hand, and identification interfaces, on the other hand.

With the identification interfaces the invention provides that the carrier structure has in the region of at least one of its recesses a device-side identification interface component, which is contacted in an identification data-transmitting manner by a corresponding, module-side identification interface component, when a functional module is inserted. In this case the device-side identification interface components can be designed as optical, magnetic, tactile, or radio receiving units; and the module-side identification interface components can be designed as corresponding optical, magnetic, tactile, or radio transmitting units. The background of these measures is to create a way to automatically detect and identify the respectively installed functional modules. In particular, an automatic detection of the module constellation can be provided by the control unit of the balance.

With the thermal interfaces the invention provides an automatic connection of the functional modules, i.e., the changing heat sources, to a central cooling apparatus of the balance. All of the module receptacles, i.e., all of the positions, at which active, i.e., heat-generating functional modules can be installed, are equipped with device-side thermal interface components, which, however, are only used, as necessary, i.e., if a functional module with corresponding, module-side thermal interface components is actually installed. In cases, where no functional module is installed in a given module receptacle, the device-side thermal interface component has no partner, that is, it is not contacted. Such a module receptacle, which is not occupied by an active functional module, can be closed with a panel or a passive (i.e., non-heat-generating) functional module. In this case such a panel or such a passive functional module can be equipped optionally with suitable thermal insulation (schematically represented with reference symbol $I_n$ in FIG. 3) so that the uncontacted device-side thermal interface component does not represent a cold source that interferes with the temperature distribution in the weighing chamber.

As an alternative, it may be provided that the overall thermal design of the balance is carried out in a way that takes into account such cold sources, that is, that the desired temperature distribution in the weighing chamber occurs, in particular, in the case of uncontacted device-side thermal interface components, thus, without installed active functional modules.

When an active functional module is installed, the mutual thermal interface components are automatically contacted, so that the cooling apparatus can dissipate the heat, generated in the functional module, in a compensating manner. Such a thermal interface can be implemented, for example, in the form of two, preferably mutually spring-loaded metal plates (shown simply in schematic form in FIG. 5), of which one is thermally coupled to the cooling apparatus; and the other is thermally connected to the heat source of the functional module. These plates are positioned relative to one another on the balance, in particular, in the region of the module receptacle, or on the functional module in such a way that they come into contact with one another, preferably in a spring loaded manner, when the functional module is inserted into the module receptacle.

According to a third aspect of the invention, a special controller is provided that is based on the previously discussed interfaces of the second aspect of the invention. This information about the identity of the inserted modules can be used, in particular, to adapt the functional control of the balance, in particular, to control the cooling. However, the adaptation of the operating routine to the respectively detected module constellation performed in the control apparatus can affect all of the variable aspects of the system operation.

In this case it is preferably provided that the control apparatus is programmed to control the cooling apparatus with a static basic cooling capacity, which is dependent on the type and number of the identified functional modules. In such an embodiment it is possible to dispense with a complex closed loop temperature control, for the most part. In particular, it has been found that if the balance is set up at a suitable installation site without excessive fluctuations in the environmental parameters, as is the typical case for laboratory balances, it suffices to operate the cooling apparatus with a static cooling capacity, which is discussed here as the basic cooling capacity. However, the required basic cooling capacity is a function of the specific module constellation. This applies to a particularly high degree to cases, where active modules, which introduce a positive heat output into the weighing chamber, are installed. Examples thereof are lights, displays, ionizers, code scanners, motor driven elements, such as lifting apparatuses, etc. At the manufacturer the module-specific heat outputs are precisely known. In this case said heat outputs may be values that are specific to the type of module or even values that are specific to the individual module. Consequently at the manufacturer the associated heat output or rather the amount of cooling capacity that is required to compensate for said heat output and by which the basic cooling capacity is increased as soon as the installation of the corresponding module has been detected, based on the identification interface, can be stored in the memory of the control apparatus for each conceivably installed module. Therefore, the adaptation of the temperature control is carried out through a static control of the cooling apparatus and does not need a complex closed loop control.

In this context the concept of the memory of the control apparatus as well as the concept of the storage of algorithms and/or values in the memory are to be understood in a broad sense. It goes without saying that it comprises local memories. However, it can also refer to external memories, for example, a cloud or an external server. Thus, in the context of the present invention it should also be possible for the control apparatus to transmit the determined module constellation to an external unit, for example, over the Internet and from there to receive the specific information for selecting the appropriate operating routine. This embodiment of the invention has the advantage that information about newly developed modules needs only to be stored centrally and does not have to be updated, for example, with a firmware update in each local control apparatus.

In this context it is particularly advantageous if each device-side thermal interface component has a device-side contacting area; and if the device-side contacting areas are identical to one another with respect to size, and that each module-side thermal interface component has a module-side contacting area; and the module-side contacting areas vary in size depending on the specific module. In this case it can be provided, in particular, that the size of each module-side contacting area is equal to or smaller than the size of the device-side contacting areas and is dependent on the average operating heat output of the respective functional module. In other words, in this further development, therefore, a maximum standard size of the device-side contacting areas is provided, whereas the module-side thermal interface components are generally smaller and in any case adapted to the heat output of their functional modules. As a result, of the total cooling capacity of the cooling apparatus that is applied in a uniformly distributed manner to the device-side thermal interface components on account of the common coupling and the identical design of the device-side contact areas, each functional module taps off only such a fraction that would correspond to that fraction of the total heat output that is produced by the respective module. Thus, modules with a higher heat output experience greater cooling; modules with a lower heat output experience weaker cooling.

In the preferred control of the cooling apparatus, which statically supplies exactly that total cooling capacity that is required to compensate for the total heat output, introduced by the functional modules, it is provided advantageously that the sizes of the module-side contact areas are matched with one another in such a way that each functional module taps off the amount of cooling capacity, which will compensate for its average operating heat output, from the cooling capacity, which is uniformly distributed to all of the device-side thermal interface components. This feature can be implemented, in particular, in that the sizes of the module-side contact areas are linearly dependent on the average operating heat output of the respective functional module. For example, the module-side contact area of a functional module, which generates twice the heat output of a reference module, can be twice as large as the module-side contact area of the reference module.

Finally, a fourth aspect of the invention relates to the sealing of the weighing system chamber. This aspect is in apparent conflict of objectives with the above discussed accessibility of all interfaces and the lattice-like construction of the weighing chamber wall. Therefore, in order to overcome this conflict of objectives, the invention provides that the recesses of the carrier structure are closed on the weighing system chamber side with a securely installed end wall. In other words, the weighing chamber wall in question is designed as a double layer. Towards the weighing chamber, the recesses of the present invention are open and have the device-side interface components that are accessible from the weighing chamber. In contrast, on the weighing system chamber side, all of the recesses are closed with a non-detachable wall, so that access from the weighing chamber to the weighing system chamber is not possible. Consequently the weighing system chamber remains sealed so that the calibratability of the balance is not adversely affected. At the same time, however, the advantages of the invention that are explained in the introduction with regard to the flexibility during assembly can be fully utilized.

All four aspects of the invention interact in such a way that a calibratable system is created that is in no way inferior to the known, non-calibratable system in terms of the flexibility of the requirement-specific assembly of the balance.

Other features and advantages of the invention will become apparent from the following specific description and the drawings.

BRIEF DESCRIPTION OF THE DRAWINGS

In the Drawings:

FIG. 5: is a simple schematic representation of the spring-loaded metal plates from FIG. 3.

DETAILED DESCRIPTION

Figure 1:
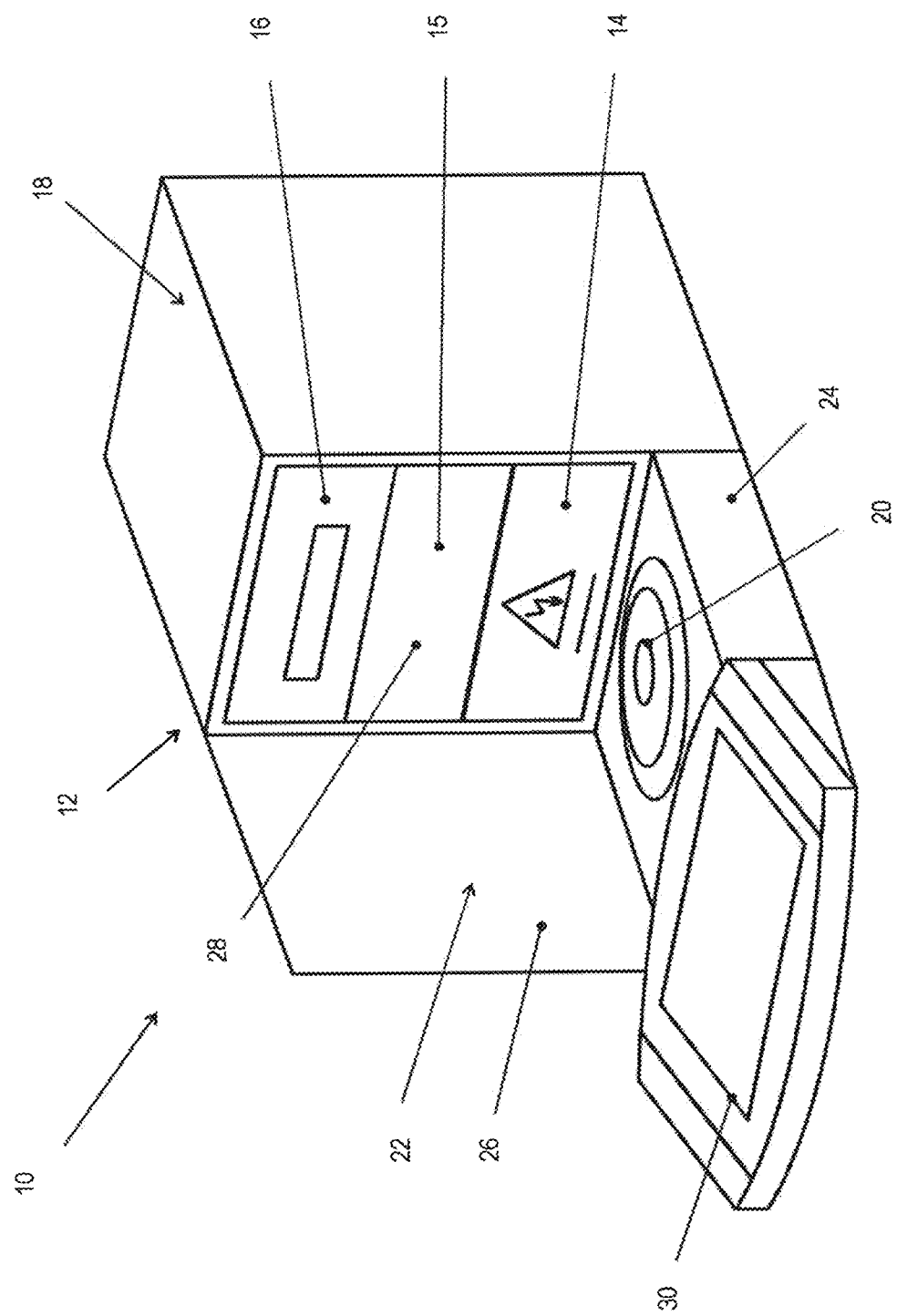
FIG. 1: is a schematic representation of a gravimetric measuring system according to the invention in the final state of assembly with an incompletely illustrated weighing chamber wall.

Identical reference numerals and symbols in the figures indicate the same or analogous elements.

FIG. 1 shows a schematic representation according to the invention of a gravimetric measuring system 10, which consists substantially of a balance 12 and two functional modules 14, 16, inserted therein, as well as a panel 15. In the embodiment shown, the functional module, provided with the reference numeral 14, is a laser scanner unit, which is suitable for detecting bar codes; and the functional module, provided with the reference numeral 16, is a lighting unit. However, the specific functions of the functional modules 14, 16 play no role in the context of the present invention.

Figure 3:
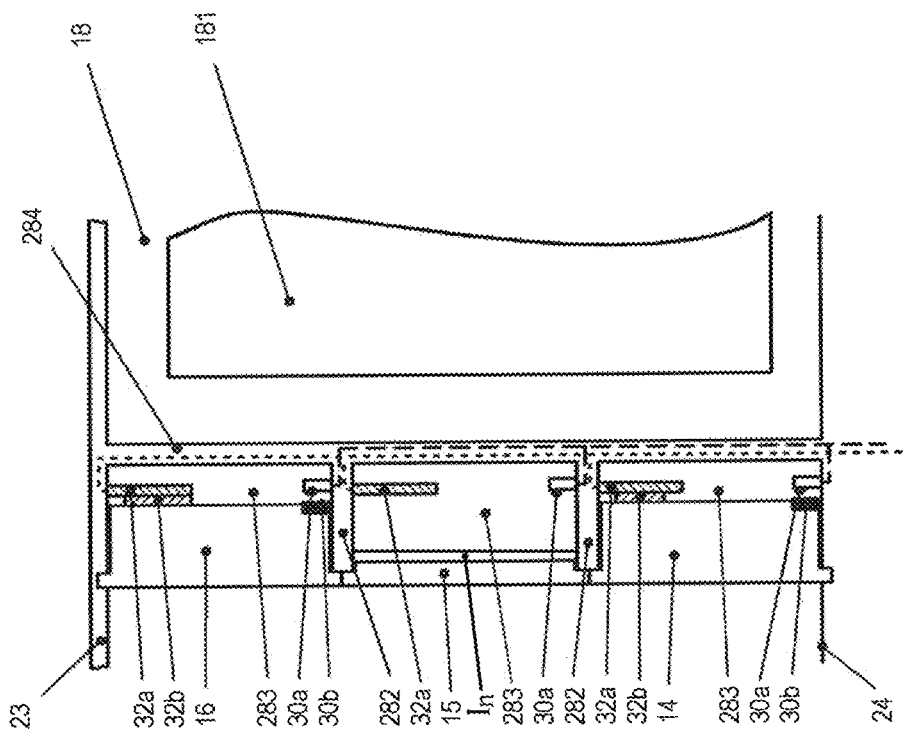
FIG. 3: is an incomplete sectional view of the weighing chamber rear wall of the balance of the gravimetric measuring system from FIG. 1 and adjacent areas.

In the embodiment shown, the balance 12 substantially comprises three regions, namely a weighing system chamber 18, in which a weighing system 181, indicated in FIG. 3, is arranged. The specific construction of the weighing system 181 does not play a role in the context of the present invention. In each case the weighing system 181 comprises a load receptacle (not shown separately), which is connected to a sample carrier 20, which in turn is arranged in a weighing chamber 22, adjoining the weighing system chamber 18 in the embodiment shown. The weighing chamber 22 is surrounded by a weighing chamber wall, which is shown only incompletely in FIG. 1. In particular, the weighing chamber base 24, through which the sample carrier 20 extends, a weighing chamber side wall 26 and a weighing chamber rear wall 28, all of which will be described in greater detail below, are illustrated. In the representation in FIG. 1, the weighing chamber rear wall 28 is covered substantially by the front sides of the functional modules 14, 16 and the panel 15, which is arranged between these functional modules 14, 16. Typically the weighing chamber wall also comprises an additional weighing chamber side wall, a weighing chamber front wall and a weighing chamber cover 23 (indicated only in FIGS. 2 and 3), but none of these are shown in FIG. 1 for reasons of better clarity.

Furthermore, the balance 12 comprises an electronic unit 30, which in the case of the embodiment shown comprises essentially a large format display. The electronic unit 30 can additionally contain a control apparatus, which will be explained in more detail below. However, this control apparatus can also be arranged at another location of the balance 12. It is considered to be advantageous if this control unit is arranged so as to be thermally insulated from the weighing system chamber 18 and from the weighing chamber 22.

Figure 2:
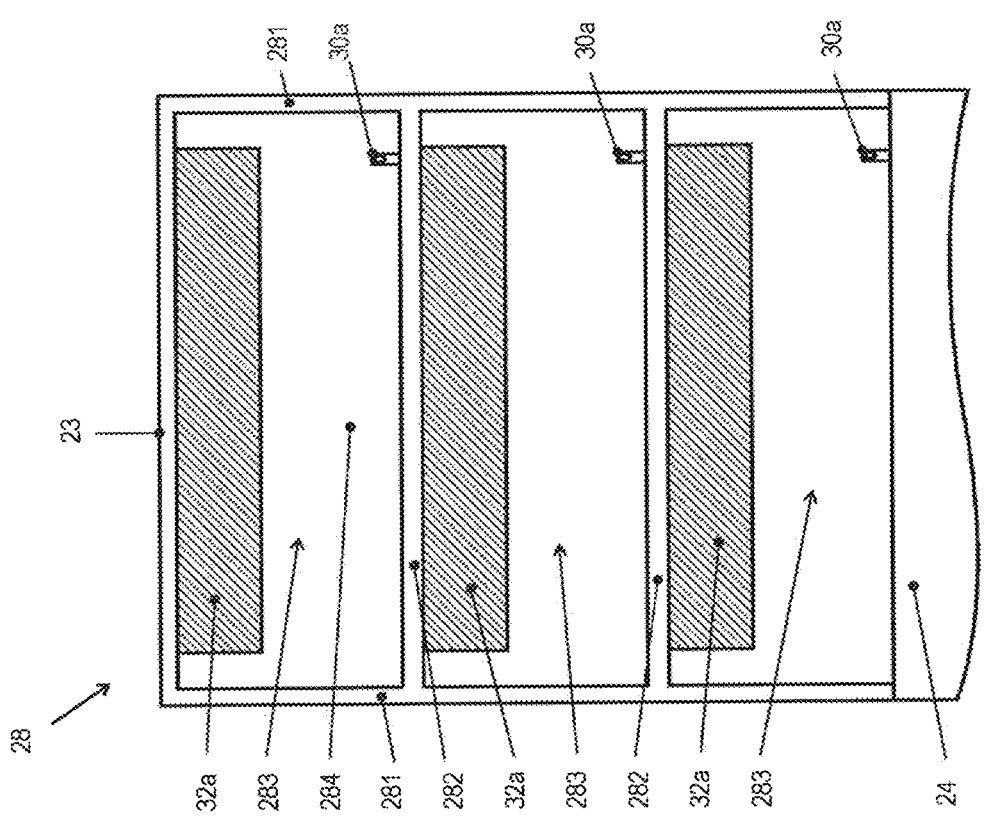
FIG. 2: is the weighing chamber rear wall of the balance of the gravimetric measuring system from FIG. 1 in an intermediate state of assembly without inserted functional modules or panels.

FIG. 2 shows a frontal view of the weighing chamber rear wall 28, but without the inserted functional modules 14, 16 and without the panel 15. FIG. 3 shows a sectional view of the weighing chamber rear wall 28 and adjoining regions of the balance 12, although the illustration of FIG. 3 also shows the inserted functional modules 14, 16 and the inserted panel 15. Despite this difference an integrated view of FIGS. 2 and 3 makes it easier to understand the following description.

The weighing chamber rear wall 28 is constructed of vertical posts 281 and struts 282, arranged transversely thereto. Between these, there extend recesses 283, which are also referred to herein as module receptacles 283. On the weighing system chamber side, the weighing chamber rear wall 28 has an end wall 284, which seals the weighing system chamber 18 and which prevents access through the module receptacles 283 into the weighing system chamber 18. In the illustrated embodiment the end wall 284 is at the same time the front wall of the weighing system chamber 18.

The module receptacles 283 serve to house in a spatially adapted manner the functional modules 14, 16. The embodiment according to FIGS. 1 and 3 has no functional module is inserted into the central module receptacle 283 depicted in FIGS. 2 and 3. Instead, this recess 283 between the posts 281 and struts 282 is closed off with the panel 15 towards the weighing chamber. The module receptacles 283 are designed identically with respect to their configuration, as will be described in greater detail below, so that the functional modules 14, 16 can be inserted, like other, compatibly designed functional modules into each of the module receptacles 283. With regard to their size the module receptacles 283 are designed preferably identically, in particular so that they merge into each other, and preferably without a separating element. This permits the functional modules 14, 16, the size of which corresponds to an integer multiple of a unit size, to be inserted so as to fit exactly into one or more adjacent module receptacles 283. It is also feasible that the sizes of the module receptacles 283 themselves are different integer multiples of a unit size. The same applies to the panels 15 as to the functional modules 14, 16.

Each module receptacle 283 has a device-side identification interface component 30a, which can interact with a corresponding module-side identification interface component 30b of an inserted functional module 14, 16, in order to identify the inserted functional module 14, 16 and to connect it to a control unit through a corresponding data line (dashed lines).

Furthermore, each module receptacle 283 has a device-side thermal interface component 32a, which is in thermal contact with a corresponding module-side thermal interface component 32b of an inserted functional module 14, 16. The device-side thermal interface components 32a are thermally connected (dotted lines) to one another and to a cooling apparatus 34, as depicted in FIG. 4.

Although additional interfaces, such as, for example, electrical and data interfaces, for controlling the functional modules 14, 16 are preferably provided, they are not shown in the figures for the sake of clarity.

A special feature of the module-side thermal interface components 32b of the illustrated embodiment lies in the fact that in comparison to the device-side thermal interface components 32a, and to one another, they have different contact area sizes. All of the module-side thermal interface components 32b are smaller than or at most just as large as the device-side thermal interface components 32a that are identical to one another with respect to size. The specific size of the module-side contact areas depends on the heat output of the respective functional modules 14, 16. In particular, there can be a proportionality between the heat output and the size of the thermal contact area of the modules.

Figure 4:
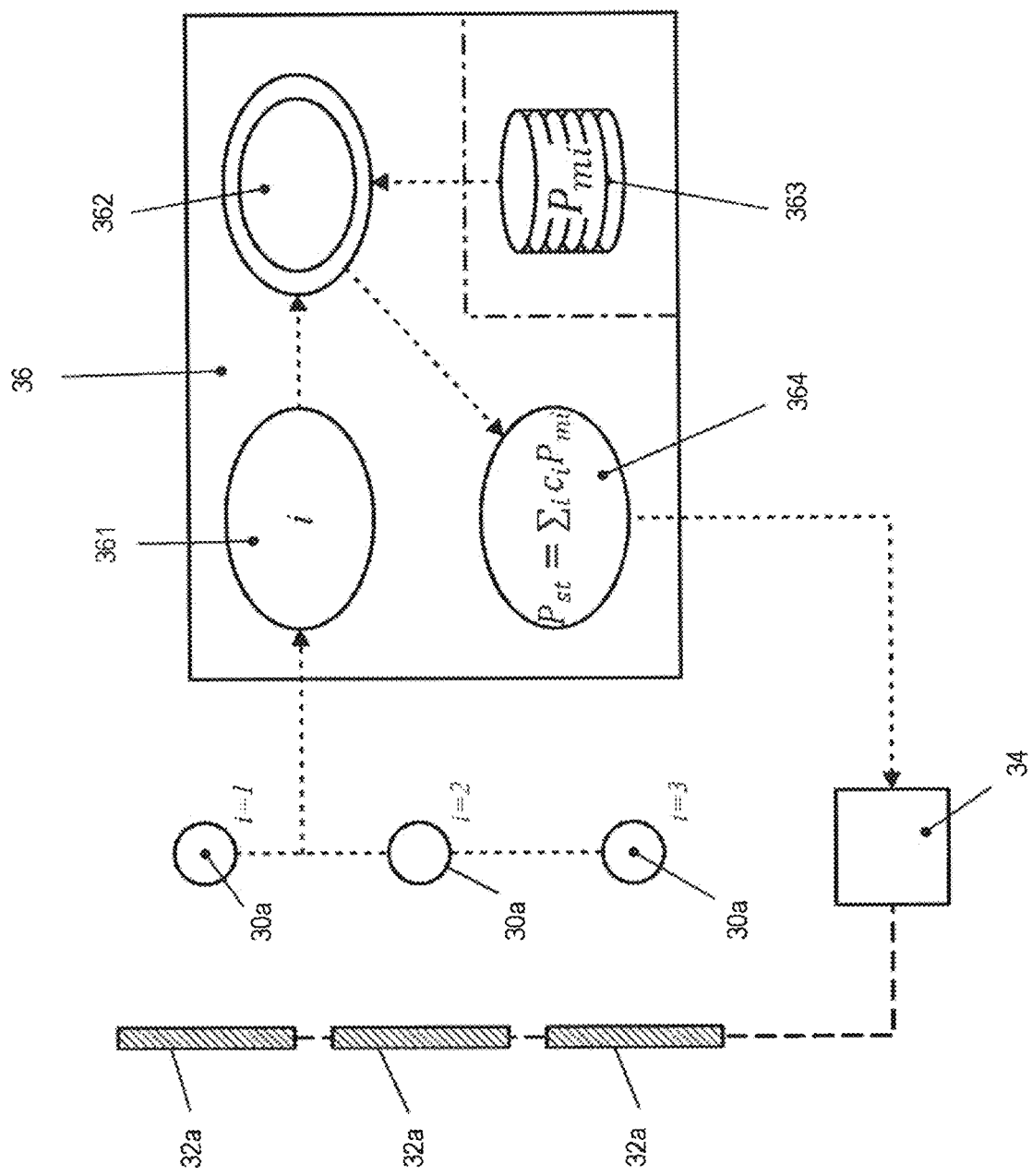
FIG. 4: is a schematic representation of a preferred cooling control of the balance of the gravimetric measuring system from FIG. 1.

FIG. 4 shows a preferred embodiment of a control of the balance 12. Shown are the device-side thermal interface components 32a, which are thermally connected to one another and to a cooling apparatus 34, and the device-side identification interface components 30a, which are identified here in each case with the index i. The identification data, obtained through interaction between the device-side and module-side identification interface components 30a, b, are transmitted to a control apparatus 36, and there, in particular, to the identification unit 361. In the embodiment shown in FIGS. 1 and 3, the identification interface i=1 would provide the information about the inserted lighting module 16. The identification interface i=2 would provide the information about the absence of an inserted functional module; and the identification interface i=3 would provide the information about the inserted laser scanner module 14. The identification can be carried out in a manner specific to the type of module or even in a manner specific to the individual module. The identification data are sent from the identification unit 361 to a central unit 362. The latter receives information about the specific heat outputs of the identified functional modules 14, 16 from a memory unit 363. As indicated by the dotted and dashed line, the memory unit 363 can be integrated in the control apparatus 36 or can be made available remote therefrom, for example, in a server, connected through the Internet. However, this information can also be stored in a memory unit of the functional module itself. In particular, it can be provided that after the functional module has been produced, said functional module is run through an individual measurement of its heat output at the factory in the context of the quality control, the result of which measurement is then stored in the memory unit. A type-specific storage without individual measurement is also possible. In any case the storage of the information in the module itself combines the advantages of reducing the load on the balance control unit, the independence of external data sources and the possibility of customization.

From the identification data, on the one hand, and the heat output data, on the other hand, the central unit 362 calculates the default values for controlling the cooling apparatus 34; and then said default values are passed on to a cooling control unit 364, connected to the cooling apparatus. In the illustrated embodiment the predetermined cooling capacity $P_{st}$ corresponds to a static cooling capacity, which is derived from the sum of the individual heat outputs $P_{mi}$ of the identified functional modules 14, 16, in each case multiplied by a weighting factor $P_{st}=\Sigma_{ei} c_i P_{mi}$. In this case the total cooling capacity P is obtained as the sum of a module-independent basic cooling capacity $P_0$ (not mentioned in FIG. 4) and the module-dependent static cooling capacity $P_{st}$: $P=P_0+P_{st}+P_v$ The weighting factor $c_i$ can be used, for example, to take into account the specific position, i.e., the specific module receptacle, in which a functional module 14, 16 is inserted. Of course, such a weighting can also be dispensed with; in other words, the weighting factor corresponds then to 1 and/or is identical in all summands.

This static cooling capacity $P_{st}$ is uniformly distributed from the cooling apparatus 34 to all of the device-side thermal interface components 32a. The respective, requirement-specific distribution to the functional modules 14, 16 takes place in response to the different sizes of the module-side thermal interface components 32b.

In a further development of this cooling control, the static cooling capacity $P_{st}$ forms only one of a plurality of terms of the total cooling capacity P: $P=P_0+P_{st}+P_v$, where $P_v=P_v(T)$. In this embodiment, in addition to the static cooling capacity $P_{st}$, there is also provided a small, regulated cooling capacity contribution, the cooling capacity correction $P_v$, with which it is possible to compensate for small fluctuations of the temperature T in the weighing chamber 22.

The embodiments, discussed in the specific description and shown in the figures, represent only illustrative exemplary embodiments of the present invention. In light of the disclosure herein, the person skilled in the art is given a broad spectrum of possible variations. In particular, it is possible, as an alternative or in addition to the weighing chamber rear wall 28, to design one or more of the remaining walls of the weighing chamber wall in the manner described as a post/strut structure with recesses designed as module receptacles. In such cases, in which the module receptacles do not adjoin a chamber to be sealed, in particular, for reasons of calibration, a special sealing wall, as in the embodiment shown here, is not necessary.

LIST OF REFERENCE NUMERALS AND SYMBOLS

10 Gravimetric measurement system
12 Balance
14 Functional module
15 Panel
16 Functional module
18 Weighing system chamber
181 Weighing system
20 Sample carrier
22 Weighing chamber
23 Weighing chamber cover
24 Weighing chamber base
26 Weighing chamber side wall
28 Weighing chamber rear wall
281 Post
282 Strut
283 Recess/module receptacle
284 End wall
30a/b Device-side/module-side identification interface component
32a/b Device-side/module-side thermal interface component
34 Cooling apparatus
36 Control apparatus
361 Identification unit
362 Central unit
363 Memory unit
364 Cooling control unit P Total cooling capacity
$P_0$ Basic cooling capacity
$P_v$ Cooling capacity correction
$c_i$ Weighting factor
$P_{mi}$ Module-specific heat output
T Temperature (in the weighing chamber)
$I_n$ Insulation

What is claimed is:

1. A gravimetric measuring system, comprising:
   a balance with a weighing chamber surrounded by a plurality of weighing chamber walls;
   an electromechanical weighing system enclosed by an adjoining weighing system chamber;
   an electronic control apparatus for controlling the weighing system operation according to algorithms stored in a memory of the electronic control apparatus; and
   a plurality of functional modules that generate heat during operation and are configured for insertion into module receptacles arranged on at least one of the weighing chamber walls;
   wherein the module receptacles comprise:
      device-side thermal interface components that are thermally connected to one another and to a central cooling apparatus, and
      respective device-side identification interface components,
   wherein the functional modules comprise:
      module-side thermal interface components that correspond respectively to the device-side thermal interface components and, in an inserted state of the respective functional module, thermally contact the device-side thermal interface component of the respectively associated module receptacle, and
      respective module-side identification interface components that correspond respectively to the device-side identification interface components,
   wherein the control apparatus is programmed to identify each functional module, inserted into a respective one of the module receptacles, through interaction between the respective device-side and module-side identification interface components and to select one of a plurality of operating routines according to the algorithms stored in the memory of the control apparatus,
   wherein at least one of the weighing chamber walls forms a separating element between the weighing chamber and the weighing system chamber that is constructed of spaced posts and struts which form an open-sided lattice-like carrier structure having recesses that form the respective module receptacles, and
   wherein the recesses are closed on a side of the weighing system chamber by a fixedly installed end wall and are closed on a side of the weighing chamber either by panels that have no weighing function and are spatially adapted respectively to the recesses, or by the functional modules.

2. The gravimetric measuring system as claimed in claim 1, wherein the control apparatus is programmed to control the cooling apparatus with a static basic cooling capacity ($P_0$) that is dependent on a type and number of the identified functional modules.

3. The gravimetric measuring system as claimed in claim 2, wherein:
   each device-side thermal interface component has a device-side contacting area and the device-side contacting areas are identical to one another with respect to size,
   each module-side thermal interface component has a module-side contacting area and the module-side contacting areas vary between one another in size, and
   the size of each of the module-side contacting areas is equal to or smaller than the size of the device-side contacting areas and is dependent on an average operating heat output of the respective functional module.

4. The gravimetric measuring system as claimed in claim 3, wherein the size of each module-side contacting area is dependent on the average operating heat output of the respective functional module such that each functional module taps off an amount of cooling capacity which compensates for an average operating heat output from the cooling capacity (P), which is uniformly distributed to all of the device-side thermal interface components.

5. The gravimetric measuring system as claimed in claim 1, wherein the device-side thermal interface components and the module-side thermal interface components are mutually spring-loaded metal plates, and
   wherein one of the spring-loaded metal plates is thermally coupled to the cooling apparatus and another of the spring-loaded metal plates is thermally connected to the heat source of the functional module.

6. The gravimetric measuring system as claimed in claim 5, wherein the metal plates form a spring-loaded connection when the functional module is inserted into the module receptacle.

7. The gravimetric measuring system as claimed in claim 1, wherein the panels are equipped with thermal insulation such that an uncontacted device-side thermal interface component does not represent a cold source that interferes with temperature distribution in the weighing chamber.

* * * * *